United States Patent
Takahashi et al.

(10) Patent No.: US 6,355,357 B1
(45) Date of Patent: Mar. 12, 2002

(54) FLEXIBLE PRINTED BOARD, POLYAMIC ACID AND POLYAMIC ACID VARNISH CONTAINING SAME

(75) Inventors: Satoshi Takahashi; Hidetsugu Namiki, both of Kanuma (JP)

(73) Assignee: Sony Chemicals Corp., Tokyo (JP)

(*) Notice: Subject to any disclaimer, the term of this patent is extended or adjusted under 35 U.S.C. 154(b) by 0 days.

(21) Appl. No.: 09/456,387

(22) Filed: Dec. 8, 1999

(30) Foreign Application Priority Data

Dec. 21, 1998 (JP) .......................................... 10-363345
Jan. 21, 1999 (JP) .......................................... 11-013654

(51) Int. Cl.[7] .................... B32B 27/00; B32B 15/08; C08G 73/10; C08L 77/00
(52) U.S. Cl. ................ 428/473.5; 428/411.1; 428/457; 428/458; 525/420; 525/436; 528/125; 528/128; 528/170; 528/172; 528/173; 528/183; 528/188; 528/220; 528/229; 528/322; 528/327; 528/350; 528/353
(58) Field of Search ............... 428/473.5, 458, 428/411.1, 457; 528/125, 128, 170, 172, 173, 183, 188, 229, 220, 322, 327, 350, 353; 525/420, 436

(56) References Cited

U.S. PATENT DOCUMENTS 4,705,720 A * 11/1987 Kundinger et al. ......... 428/332
5,387,493 A * 2/1995 Imabayashi et al. ........ 430/280
5,397,847 A * 3/1995 Harris et al. ................ 525/432
5,418,066 A * 5/1995 Chen et al. .................. 428/458
6,133,408 A * 10/2000 Chiu et al. .................. 528/353

FOREIGN PATENT DOCUMENTS

EP    0 659 553 A1    6/1995
JP    A-60-157286    8/1985

* cited by examiner

*Primary Examiner*—P. Hampton-Hightower
(74) *Attorney, Agent, or Firm*—Oliff & Berridge, PLC

(57) ABSTRACT

A flexible printed board, in which a polyimide resulting from the imidation of a polyamic acid obtained by the addition polymerization of diamines and acid dianhydrides is formed as an insulating layer on a metal foil, is characterized in that the diamines include specific imidazolyl-diaminoazines represented by the formula 1;

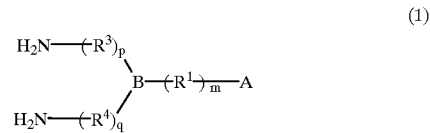

(1)

(where A is an imidazolyl group; $R^1$ is an alkylene group; m is 0 or 1; $R^2$ is an alkyl group; n is 0, 1, or 2; $R^3$ and $R^4$ are alkylene groups; p and q are each 0 or 1; and B is an azine residue, diazine residue, or triazine residue).

14 Claims, No Drawings

FLEXIBLE PRINTED BOARD, POLYAMIC ACID AND POLYAMIC ACID VARNISH CONTAINING SAME

BACKGROUND OF THE INVENTION

1. Field of the Invention

The present invention relates to a flexible printed board provided with a rust-resistant polyimide insulating layer. It also relates to a novel polyamic acid that yields a rust-inhibiting polyimide as a result of an imidation treatment.

2. Related Art of the Invention

Flexible printed boards in which polyimide insulating layers are formed directly on metal foil such as copper foil without an interposed adhesive are fabricated by methods in which polyamic acid varnishes obtained by the addition polymerization of aromatic diamines (such as paraphenylenediamine) and aromatic dianhydrides (such as pyromellitic dianhydride) in solvents such as N-methyl-2-pyrrolidone are applied to the copper foil and dried to yield a polyamic acid layer (polyimide precursor layer), and the product is heated and imidated at 300 to 350° C. to form a polyimide insulating layer.

Such polyamic acids are also used as starting materials for moldings, films, insulating varnishes, adhesives, and the like.

The presence of carboxyl groups in the polyamic acids is disadvantageous in that when copper foil is coated with polyamic acid varnishes in the manner described above, the copper foil surfaces are corroded and discolored, and copper ions are produced, causing electrical migration in the flexible printed boards.

Imidazole-based rust-inhibitors (for example, Adekastub CDA-1, manufactured by Asahi Denka) are commonly added to the polyamic acid varnishes used in the manufacture of flexible printed boards.

Conventionally used rust-inhibitors are disadvantageous, however, in that they dissolve poorly in polyamic acid varnishes, create excessive blooming on the polyimide surface when heated to a high temperature during imidation, and reduce the adhesive strength of polyimides in relation to copper foil. In addition, the rust-inhibitors are scattered during imidation, forming a resinous substance that deposits on the imidation equipment or flexible printed board products and contaminates them.

SUMMARY OF THE INVENTION

An object of the present invention, which was perfected in order to overcome the above-described shortcomings of prior art, is to provide a flexible printed board whose polyimide insulating layer has adequate adhesive strength with respect to copper foil and is free of the problems associated with electrical migration even in the absence of rust-inhibitors such as those promoting blooming and resinous substance formation during the imidation of polyamic acids.

Another object of the present invention is to provide novel polyamic acids which are as precursors of such polyimides.

The inventors perfected the present invention upon discovering that the stated objects can be attained by using specific imidazolyl-diaminoazines as the diamine components of polyamic acids, introducing azine structures into the main chains of the polyamic acids, and introducing imidazole rings into the side chains thereof.

Specifically, the present invention provides a flexible printed board in which a polyimide resulting from the imidation of a polyamic acid obtained by the addition polymerization of diamines and acid dianhydrides is formed as an insulating layer on a metal foil, wherein this flexible printed board is characterized in that the diamines include imidazolyl-diaminoazines represented by the formula 1;

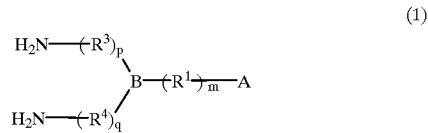

(1)

(where A is an imidazolyl group represented by the formula 1a, 1b, or 1c;

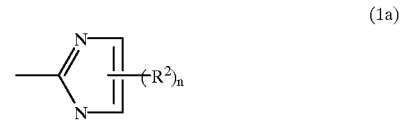

(1a)

(1b)

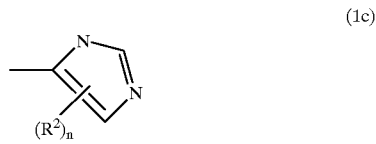

(1c)

$R^1$ is an alkylene group; m is 0 or 1; $R^2$ is an alkyl group; n is 0, 1, or 2: $R^3$ and $R^4$ are alkylene groups; p and q are each 0 or 1; and B is an azine residue, diazine residue, or triazine residue).

The present invention also provides a novel polyamic acid, obtained by the addition polymerization of diamines and acid dianhydrides, wherein said polyamic acid is characterized in that the diamines include imidazolyl-diaminotriazines represented by the formula 10;

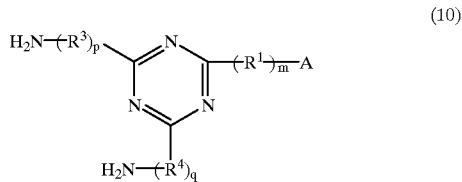

(10)

(where A is an imidazolyl group represented by the formula 1a, 1b, or 1c

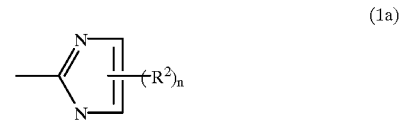

(1a)

(1b)

-continued

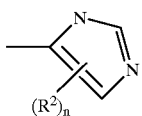
(1c)

$R^1$ is an alkylene group; m is 0 or 1; $R^2$ is an alkyl group; n is 0, 1, or 2; $R^3$ and $R^4$ are alkylene groups; and p and q are each 0 or 1).

These and other objects, features and advantages of the present invention are described in or will become apparent from the following detailed description of the invention.

DETAILED EXPLANATION OF THE INVENTION

The flexible printed board of the present invention will now be described in detail.

The flexible printed board is configured by forming an insulating layer composed of a polyimide on metal foil. A compound resulting from the imidation of a polyamic acid obtained by the addition polymerization of diamines and an acid dianhydride may be used as such a polyimide. Here, the addition polymerization and imidation conditions can be appropriately established on the basis of conditions conventionally employed for the addition polymerization and imidation of polyamic acids.

In the flexible printed board of the present invention, imidazolyl-diaminoazines represented at least by the formula 1 may be used as such diamines.

Here, when m is 0, there are no alkylene groups $R^1$, and the imidazole ring and azine, diazine, or triazine residue are directly bonded. Methylene, ethylene, and propylene can be cited as examples of the alkylene groups $R^1$ when m is 1.

When n is 0, there are no alkyl groups $R^2$, and a hydrogen atom is bonded to the imidazole ring. Methyl and ethyl can be cited as examples of the alkyl groups $R^2$ when n is 1. When n is 2, two $R^2$ groups are bonded to the imidazole ring, and methyl and ethyl may be independently cited as examples of each type of alkyl group $R^2$. $R^2$ may occasionally be directly bonded to a nitrogen atom of the imidazole ring.

When p is 0, there are no alkylene groups $R^3$, and the amino group is bonded directly to the azine, diazine, or triazine residue. Methylene and ethylene can be cited as examples of the alkylene groups $R^3$ when p is 1.

When q is 0, there are no alkylene groups $R^4$, and the amino group is bonded directly to the azine, diazine, or triazine residue. Methylene and ethylene can be cited as examples of the alkylene groups $R^4$ when q is 1.

B is an azine, diazine, or triazine residue. Of diamines having these residues, diamines having a triazine residue are preferred because of their ease of synthesis and ready commercial availability.

The polyimides resulting from the imidation of polyamic acids obtained by the addition polymerization of acid dianhydrides and diamines of the formula 1 contain imido units represented by the formula 2 below;

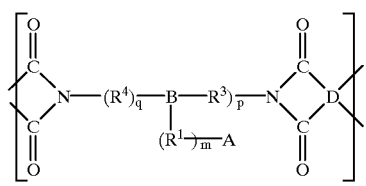
(2)

(where A is an imidazolyl group represented by the formula 1a, 1b, or 1c in the same manner as above;

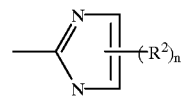
(1a)

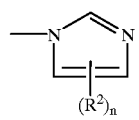
(1b)

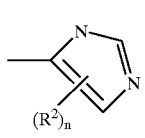
(1c)

where $R^1$, $R^2$, $R^3$, $R^4$, m, n, p, q, and B are the same as above, and D is an acid dianhydride residue).

The polymer itself is resistant to rust because the polyimide containing such imido units contains imidazole residues having a rust-inhibiting effect in the side chains thereof. Forming an insulating layer from a polyimide containing such imido units will therefore yield a flexible printed board whose polyimide insulating layer has adequate adhesive strength with respect to copper foil and is free of the problems associated with electrical migration even in the absence of rust-inhibitors such as those promoting blooming and resinous substance formation during the imidation of polyamic acids.

Setting the coefficient of linear thermal expansion of the polyimide used in the present invention at or slightly above the coefficient of linear thermal expansion of the metal foil used is preferred in terms of preventing the flexible printed board (and a wiring board fabricated therefrom) from undergoing excessive curling (or a convexity from being formed on the polyimide side due to curling). The coefficient of linear thermal expansion of the polyimide can be adjusted by combining diamines and acid dianhydrides, as disclosed in Japanese Patent Application Laid-open No. SHO60-157286 and elsewhere.

In the polyimide containing imidazolyl-diaminoazines of the formula 1 in accordance with the present invention, the elongation of the contained polyimide decreases and the material becomes brittle or less heat-resistant with increased amount of imidazolyl-diaminoazines, but the joint use of other diamines endows the polyimide with a film strength that allows the material to be used for flexible printed boards.

The addition weight of the diamines and acid dianhydrides may be shifted toward excess diamines or excess acid dianhydrides, although an equimolar ratio is preferred.

The following compounds (for which p and q are both 0) can be cited as specific examples of the preferred imidazolyl-diaminoazines of the formula 1.

2,4-diamino-6-[2-(2-methyl-1-imidazolyl)ethyl]-s-triazine, 2,4-diamino-6-[2-(2-ethyl-1-imidazolyl)ethyl]-s-triazine, 2,4-diamino-6-[1-(2-undecyl-1-imidazolyl)ethyl]-s-triazine, 2,4-diamino-6-[2-(2-imidazolyl)ethyl]-s-triazine, 2,4-diamino-6-[2-(1-imidazolyl)ethyl]-s-triazine, 2,4-diamino-6-(2-ethyl-4-imidazolyl)-s-triazine, 2,4-diamino-6-[2-(4-methyl-1-imidazolyl)ethyl]-s-triazine, 2,4-diamino-6-(2-ethyl-5-methyl-4-imidazolyl)-s-triazine, 2,4-diamino-6-(4-ethyl-2-methyl-1-imidazolyl)-s-triazine, 2,4-diamino-6-[3-(2-methyl-1-imidazolyl)propyl]-s-triazine, 2,4-diamino-6-[4-(2-imidazolyl)butyl]-s-triazine, 2,4-diamino-6-[2-(2-methyl-1-imidazolyl)propyl]-s-triazine, 2,4-diamino-6-[1-methyl-2-(2-methyl-1-imidazolyl)ethyl]-s-triazine, 2,4-diamino-6-[2-(2,5-dimethyl-1-imidazolyl)ethyl]-s-triazine, 2,4-diamino-6-[2-(2,4-dimethyl-1-imidazolyl)ethyl]-s-triazine, or 2,4-diamino-6-[2-(2-ethyl-4-methyl-1-imidazolyl)ethyl]-s-triazine.

Of these, the following compounds are preferred: 2,4-diamino-6-[2-(2-ethyl-4-methyl-1-imidazolyl)ethyl]-s-triazine, 2,4-diamino-6-[2-(2-methyl-1-imidazolyl)ethyl]-s-triazine, or 2,4-diamino-6-[1-(2-undecyl-1-imidazolyl)ethyl]-s-triazine.

In the flexible printed board of the present invention, compounds used as the diamine components of conventional polyamic acids may be used jointly in addition to the imidazolyl-diaminoazines of the formula 1. For example, aromatic diamines selected from 4,4'-diaminodiphenyl ether, paraphenylenediamine, 4,4'-diaminobenzanilide, 4,4'-bis(p-aminophenoxy)diphenyl sulfone, and 2,2-bis[4-(4-aminophenoxy)phenyl]propane may be used as the compounds preferred for such joint use.

Of these aromatic diamines, paraphenylenediamine is preferred for such joint use when the aim is to reduce the thermal expansion of the polyimide. In addition, 4,4'-diaminodiphenyl ether is preferred for such joint use when the aim is to enhance the thermal expansion of the polyimide.

The molar ratio of the imidazolyl-diaminoazines of the formula 1 and the aforementioned aromatic diamines should preferably be 2/98 to 10/90 because an excessively low content of the first component fails to provide the resulting polyimide with an adequate rust-inhibiting effect and tends to initiate electrical migration, whereas the mechanical strength or the heat resistance of the polyimide decreases as the content of the first component increases.

Compounds used as conventional polyamic acid dianhydrides may be used as the acid dianhydrides (corresponding to the acid dianhydride residue D in formula 2) constituting the insulating layer polyimide in the flexible printed board of the present invention. For example, aromatic dianhydrides selected from the following compounds are preferred for such use: pyromellitic dianhydride (PMDA), 3,4,3',4'-biphenyltetracarboxylic dianhydride (BPDA), 3,4,3',4'-benzophenonetetracarboxylic dianhydride (BTDA), or 3,4,3',4'-diphenylsulfonetetracarboxylic dianhydride (DSDA).

The thickness of a polyimide insulating layer such as that described above is not subject to any particular limitations and is usually 10 to 50 $\mu$m.

Various types of metal foil may be used for the flexible printed board of the present invention. Preferred examples include aluminum foil, copper foil, and gold foil. These metal foils may also be appropriately matted, plated, or treated with aluminum alcoholates, aluminum chelates, silane coupling agents, or the like.

The thickness of the metal foil is not limited in any particular way and is commonly 5 to 35 $\mu$m.

The flexible printed board of the present invention may be manufactured as described below.

First, imidazolyl-diaminoazines of the formula 1 and aromatic diamines, which are used jointly as needed, are heated and dissolved in a solvent (for example, N-methyl-2-pyrrolidone), and addition polymerization is performed for several hours while an acid dianhydride is slowly added at 0 to 90° C., and preferably 5 to 50° C., in an atmosphere of nitrogen gas or another inert gas. A polyamic acid dissolved in a solvent is thus obtained. The dissolved polyamic acid can be used as a polyamic acid varnish in this state without undergoing further treatments. The type of solvent used for the varnish, the amount thereof, the viscosity of the varnish, the solids content thereof, and the like can be selected appropriately.

This polyamic acid varnish is subsequently applied to the metal foil with a comma coater or the like and dried, yielding a polyamic acid layer as a polyimide precursor layer. To prevent foaming during the subsequent imidation step, the drying should preferably be performed such that the residual volatile content (content of undried solvent and of water generated by imidation) of the polyamic acid layer is 50% or lower.

The resulting polyamic acid layer is heated to 300 to 350° C. in an inert atmosphere (for example, nitrogen atmosphere) to achieve imidation and to form an insulating layer composed of a polyimide. A flexible printed board is thus obtained.

In the flexible printed board thus obtained, the surface of the copper foil or other metal foil (polyimide-formation surface) remains free from corrosion or discoloration even when no rust-inhibitor is added to the polyamic acid varnish. In addition, the flexible printed boards used as wiring substrates are devoid of the electrical migration commonly induced by copper ions. It is also possible to prevent situations in which rust-inhibitors create blooming on the polyimide surface or in which resinous substances form during imidation, and to achieve adequate adhesive strength between the copper foil and the polyimide layer.

Next, The novel polyamic acid of the present invention will now be described in detail.

The novel polyamic acid is a polyamic acid obtained by the addition polymerization of diamines and acid dianhydrides. In the present invention, imidazolyl-diaminotriazines represented at least by the formula 10 may be used as such diamines. In the formula 10, A, $R^1$, $R^2$, $R^3$, $R^4$, m, n, p, q and B are the same as defined in the Formula 1.

Specific examples of the preferred imidazolyl-diaminotriazines of the formula 10 are the same as the specific examples of the preferred imidazolyl-diaminoazines of the formula 1.

Compounds used as the diamine components of conventional polyamic acids may be used jointly in addition to the imidazolyl-diaminotriazines of the formula 10, which are used as the diamine components of the polyamic acid of the present invention. For example, aromatic diamines selected from 4,4'-diaminodiphenyl ether, paraphenylenediamine, 4,4'-diaminobenzanilide, 4,4'-bis(p-aminophenoxy)diphenyl sulfone, and 2,2-bis[4-(4-aminophenoxy)phenyl]propane may be used as the compounds preferred for such joint use.

Of these aromatic diamines, paraphenylenediamine is preferred for such joint use when the aim is to reduce the thermal expansion and to improve the heat resistance of the polyimide. In addition, 4,4'-diaminodiphenyl ether is preferred for such joint use when the aim is to enhance the thermal expansion and to improve the film-forming properties of the polyimide.

The molar ratio of the imidazolyl-diaminotriazines of the formula 10 and the aforementioned aromatic diamines should preferably be 2/98 to 10/90 because an excessively low content of the first component fails to provide the resulting polyimide with an adequate rust-inhibiting effect and tends to initiate electrical migration, whereas the heat resistance of the polyimide decreases as the content of the first component increases.

Compounds used as conventional polyamic acid dianhydrides may be used as the acid dianhydrides for the polyamic acid of the present invention. For example, aromatic dianhydrides selected from the following compounds are preferred for such use: pyromellitic dianhydride (PMDA), 3,4,3',4'-biphenyltetracarboxylic dianhydride (BPDA), 3,4,3',4'-benzophenonetetracarboxylic dianhydride (BTDA), or 3,4,3',4'-diphenylsulfonetetracarboxylic dianhydride (DSDA).

The polyamic acid of the present invention is obtained in the form of a polyamic acid dissolved in a solvent by a method in which imidazolyl-diaminotriazines of the formula 10 and an aromatic diamine, which is used jointly as needed, are heated and dissolved in a solvent (for example, N-methyl-2-pyrrolidone), and addition polymerization is performed for several hours while an acid dianhydride is slowly added at 0 to 90° C., and preferably 5 to 50° C., in an atmosphere of nitrogen gas or another inert gas. The dissolved polyamic acid can be used as a polyamic acid varnish in this form without undergoing further treatments. Such a varnish is useful as a coating solution for forming the polyimide insulating layers of flexible wiring boards. The type of solvent used for the varnish, the amount thereof, the viscosity of the varnish, the solids content thereof, and the like can be appropriately selected in accordance with the intended application or the like.

The polyamic acid of the present invention can be used to advantage in forming the polyimide insulating layers of flexible wiring boards. It is possible, for example, to obtain two-layer flexible wiring boards by a method in which copper foil is coated with a polyamic acid varnish containing the polyamic acid of the present invention, the coated foil is dried to form a polyamic acid layer, and this layer is imidated to form a polyimide layer. In the flexible wiring boards thus obtained, the surface of the copper foil (polyimide-formation surface) remains free from corrosion or discoloration even when no rust-inhibitor is added to the polyamic acid varnish. In addition, flexible wiring boards used as wiring substrates are devoid of the electrical migration commonly induced by copper ions. Furthermore, an absence of purposefully added rust-inhibitors prevents situations in which these rust-inhibitors create blooming on the polyimide surface or in which resinous substances form during imidation, and ensures that adequate adhesive strength develops between the copper foil and the polyimide layers.

EXAMPLES

The present invention will now be described in detail.

Working Examples 1 to 9; Comparative Examples 1 and 2 2,4-Diamino-6-[2-(2-ethyl-4-methyl-1-imidazolyl)ethyl]-s-triazine (2E4MZ, manufactured by Shikoku Corp.), paraphenylenediamine (PDA, manufactured by Oshin Kasei), and 4,4'-diaminodiphenyl ether (DPE, manufactured by Wakayama Seika), used in amounts of 11.6 g (0.05 mol), 81.1 g (0.75 mol), and 40.0 g (0.20 mol), respectively, were dissolved in about 3 kg of the solvent N-methyl-2-pyrrolidone (NMP, manufactured by Mitsubishi Chemical) under a nitrogen gas atmosphere in a jacketed 5-L reaction kettle, and the solution was kept at 50° C. A reaction was then allowed to occur for 3 hours under the gradual addition of 294.2 g (1.0 mol) 3,4,3',4'-biphenyltetracarboxylic dianhydride (BPDA, manufactured by Mitsubishi Chemical). A polyamic acid varnish containing the polyamic acid of Working Example 1 and having a solids content of about 14% and a viscosity of 15 Pa·S (25° C.) was thus obtained. This varnish was applied to a copper foil and dried at 100° C. or lower (which is a temperature below the imidation temperature), yielding a polyamic acid film with a thickness of about 5 μm. The IR absorption spectrum of this film was measured by a surface reflection technique (ATR technique). As a result, broad characteristic absorption attributable to polyamic acids was detected at 1710 cm$^{-1}$ (COOH), 1660 cm$^{-1}$ (CONH), and 2900 to 3200 cm$^{-1}$ (COOH, NH$_2$).

Polyamic acid varnishes of Working Examples 2 to 9 and Comparative Examples 1 and 2 were obtained by repeating the same procedures as in Working Example 1 in accordance with the mixing compositions of Table 1.

The compounds used in Table 1 were as follows.
(Acid Dianhydrides)
  BPDA: 3,4,3',4'-Biphenyltetracarboxylic dianhydride
  PMDA: Pyromellitic dianhydride
(Diamines)
  2E4MZ: 2,4-Diamino-6-[2-(2-ethyl-4-methyl-1-imidazolyl)ethyl]-s-triazine
  2MZ: 2,4-Diamino-6-[2-(2-methyl-1-imidazolyl)ethyl]-s-triazine
  C11z 2,4-Diamino-6-[2-(2-undecyl-1-imidazolyl)ethyl]-s-triazine
  PDA: Paraphenylenediamine
  DPE: 4,4'-Diaminodiphenyl ether

TABLE 1

| Examples | Acid dianhydride | Diamines (a) | (b) | (c) | Molar ratio (a)/(b)/(c) |
|---|---|---|---|---|---|
| Working Example | | | | | |
| 1 | BPDA | 2E4MZ | PDA | DPE | 5/75/20 |
| 2 | BPDA | 2E4MZ | PDA | DPE | 7.5/75/17.5 |
| 3 | BPDA | 2E4MZ | PDA | DPE | 10/75/15 |
| 4 | BPDA | 2E4MZ | PDA | DPE | 2/78/20 |
| 5 | BPDA | 2MZ | PDA | DPE | 5/75/20 |
| 6 | BPDA | C11Z | PDA | DPE | 5/75/20 |
| 7 | BPDA | 2E4MZ | DPE | — | 5/95/— |
| 8 | BPDA | 2E4MZ | PDA | DPE | 12.5/75/12.5 |
| 9 | PMDA | 2E4MZ | PDA | DPE | 5/75/20 |
| Comparative Example | | | | | |
| 1 | BPDA | — | PDA | DPE | —/80/20 |
| 2 | PMDA | — | — | DPE | —/—/100 |

Copper foil (12 μm electrolytic foil SQ-VLP manufactured by Mitsui Kinzoku) that had been soft-etched with 2% hydrochloric acid was subsequently coated with the polyamic acid varnishes of Working Examples 1 through 9 and Comparative Examples 1 and 2 and dried, yielding polyamic acid layer with a thickness of 10 μm. The resulting laminates were placed in 40° C., 90% atmosphere, and the discoloration of the copper foil surface was visually checked. The results (rust-inhibiting effects) are shown in Table 2.

Flexible printed boards were subsequently fabricated using the same polyamic acid varnishes and a copper foil as above. The copper foil was coated with the polyamic acid varnishes and dried to form polyamic acid layers with a thickness of 25 μm, and the layers were imidated by being kept for 15 minutes at 350° C. in a nitrogen atmosphere.

The copper foil of the resulting flexible printed boards was patterned to form parallel circuits with a conductor interval of 0.1 mm, yielding wiring boards. The wiring boards were allowed to stand for 7 days in a 85° C./90% Rh atmosphere while a direct-current voltage of 50 V was applied between adjacent conductor patterns. The resistance between the adjacent conductor patterns was measured following standing, and electrical migration was also measured. A resistance of $10^7$ Ω or higher was considered acceptable.

The peel strength (kg/cm) of the polyimide layers of the flexible printed boards was also measured as adhesive strength at 23° C. and 260° C. according to JIS C 6471 (peeling in a 90-degree direction at a width of 1.59 mm).

TABLE 2

| Examples | Rust-inhibiting effect (discoloration) | Electrical migration | Adhesive strength (kg/cm) | |
|---|---|---|---|---|
| | | | 23° C. | 260° C. |
| Working Example | | | | |
| 1 | None | Pass | 1.80 | 1.55 |
| 2 | None | Pass | 1.62 | 1.50 |
| 3 | None | Pass | 1.67 | 0.90 |
| 4 | None | Pass | 1.48 | 1.05 |
| 5 | None | Pass | 2.06 | 1.68 |
| 6 | None | Pass | 1.34 | 1.00 |
| 7 | None | Pass | 2.18 | 1.55 |
| 8 | None | Pass | 1.45 | 0.75 |
| 9 | None | Pass | 1.75 | 1.30 |
| Comparative Example | | | | |
| 1 | Rapid discoloration | Fail (shorting) | 1.05 | 0.63 |
| 2 | Rapid discoloration | Fail (shorting) | 1.25 | 0.20 |

The results in Table 2 demonstrate that the flexible printed boards of the present invention, which have polyimide insulating layers formed from the polyamic acid varnishes which contain the the polyamic acids in which specific imidazolyl-diaminoazines are used as the diamine components, exhibits an excellent rust-inhibiting effect without any special need to use rust-inhibitors. It can also be seen that there is no electrical migration and that excellent adhesive strength is achieved between the polyimide insulating layer and copper foil.

By contrast, the flexible printed boards of Comparative Examples 1 and 2, which were obtained without the use of specific imidazolyl-diaminoazines as diamine components, failed to demonstrate a rust-inhibiting effect, underwent electrical migration, and had inadequate adhesive strength between the polyimide insulating layer and copper foil.

As understood from the above, in the flexible printed boards of the present invention, the polyimide insulating layer, which is formed from the polyamic acids using the specific imidazolyl-diaminoazines (for examples, the polyamic acids of the present invention), has adequate adhesive strength with respect to copper foil and is free of the problems associated with electrical migration even in the absence of rust-inhibitors such as those promoting blooming and resinous substance formation during the imidation of conventional polyamic acids.

The entire disclosures of the specifications, claims and summaries of Japanese Patent applications No. 10-363345 filed on Dec. 21, 1998 and No. 11-13654 filed on Jan. 21, 1999 are herein incorporated by reference.

What is claimed is:

1. A flexible printed board, in which a polyimide resulting from the imidation of a polyamic acid obtained by the addition polymerization of diamines and acid dianhydrides is formed as an insulating layer on a metal foil, wherein said flexible printed board is characterized in that the diamines include imidazolyl-diaminoazines represented by the formula 1;

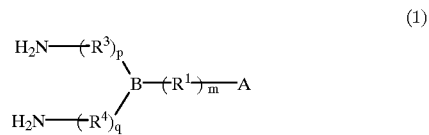

(where A is an imidazolyl group represented by the formula 1a, 1b, or 1c;

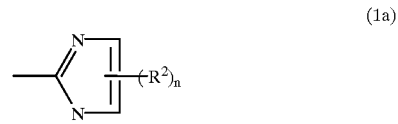

$R^1$ is an alkylene group; m is 0 or 1; $R^2$ is an alkyl group; n is 0, 1, or 2; $R^3$ and $R^4$ are alkylene groups; p and q are each 0 or 1; and B is an azine residue, diazine residue, or triazine residue).

2. A flexible printed board as defined in to claim 1, wherein the polyimide contains imido units represented by the formula 2;

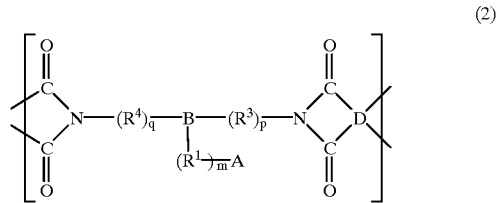

(where A is an imidazolyl group represented by the formula 1a, 1b, or 1c;

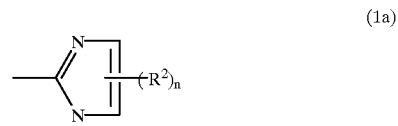

-continued (1c)

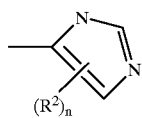

(1a)

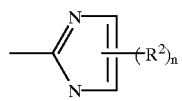

(1b)

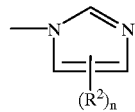

(1c)

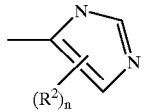

$R^1$ is an alkylene group; m is 0 or 1; $R^2$ is an alkyl group; n is 0, 1, or 2; $R^3$ and $R^4$ are alkylene groups; p and q are each 0 or 1; B is an azine residue, diazine residue, or triazine residue; and D is an acid dianhydride residue).

3. A flexible printed board as defined in claim 1, wherein B is a triazine residue.

4. A flexible printed board as defined in claim 1, wherein the imidazolyl-diaminoazines of the formula 1 include 2,4-diamino-6-s-triazine, 2,4 diamino-6-s-triazine, 2,4-diamino-6-1-imidazolyl)ethyl]-s-triazine, 2,4-diamino-6-s-triazine, 2,4-diamino-6-s-triazine, 2,4-diamino-6-s-triazine, 2,4-diamino-6-s-triazine, 2,4-diamino-6-(2-ethyl-5-methyl-4-imidazolyl)-s-triazine, 2,4-diamino-6-(4-ethyl-2-methyl-1l-imidazolyl)-s-triazine, 2,4-diamino-6-s-triazine, 2,4-diamino-6-s-triazine, 2,4-diamino-6-s-triazine, 2,4-diamino-6-s-triazine, 2,4-diamino-6-s-triazine, 2,4-diamino-6-s-triazine, or 2,4-diamino-6-s-triazine.

5. A flexible printed board as defined in claim 1, wherein the diamines further include aromatic diamines selected from the group consisting of 4,4'-diaminodiphenyl ether, paraphenylenediamine, 4,4-diaminobenzanilide, 4,4'-bis(p-aminophenoxy)diphenyl sulfone, and 2,2-bispropane.

6. A flexible printed board as defined in claim 5, wherein the imidazolyl-diaminoazine/aromatic diamine molar ratio is 2/98 to 10/90.

7. A flexible printed board as defined in claim 1, wherein the acid dianhydrides include an aromatic dianhydride selected from pyromellitic dianhydride, 3,4,3',4'-biphenyltetracarboxylic dianhydride, 3,4,3',4'-benzophenonetetracarboxylic dianhydride, or 3,4,3',4'-diphenylsulfonetetracarboxylic dianhydride.

8. A polyamic acid, obtained by the addition polymerization of diamines and acid dianhydrides, wherein said polyamic acid is characterized in that the diamines include imidazolyl-diaminotriazines represented by the formula 10;

(10)

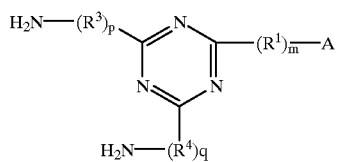

(where A is an imidazolyl group represented by the formula 1a, 1b, or 1c $R^1$ is an alkylene group; m is 0 or 1; $R^2$ is an alkyl group; n is 0, 1, or 2; $R^3$ and $R^4$ are alkylene groups; and p and q are each 0 or 1).

9. A polyamic acid as defined in claim 8, wherein the imidazolyl-diaminotriazines of the formula 10 include 2,4-diamino-6-s-triazine, 2,4-diamino-6-s-triazine, 2,4-diamino-6-s-triazine, 2,4-diamino-6-s-triazine, 2,4-diamino-6-s-triazine, 2,4-diamino-6-(2-ethyl-4-imidazolyl)-s-triazine, 2,4-diamino-6-s-triazine, 2,4-diamino-6-(2-ethyl-5-methyl-4-imidazolyl)-s-triazine, 2,4-diamino-6-(4-ethyl-2-methyl-1-imidazolyl)-s-triazine, 2,4-diamino-6-s-triazine, 2,4-diamino-6-s-triazine, 2,4-diamino-6-s-triazine, 2,4-diamino-6-s-triazine, 2,4-diamino-6-s-triazine, or 2,4-diamino-6-s-triazine.

10. A polyamic acid as defined in claim 8, wherein the diamines further include aromatic diamines selected from the group consisting of 4,4'-diaminodiphenyl ether, paraphenylenediamine, 4,4'-diaminobenzanilide, 4,4'-bis(p-aminophenoxy)diphenyl sulfone, and 2,2-bispropane.

11. A polyamic acid as defined in claim 10, wherein the imidazolyl-diaminotriazine/aromatic diamine molar ratio is 2/98 to 10/90.

12. A polyamic acid as defined in claim 8, wherein the acid dianhydrides include an aromatic dianhydride selected from pyromellitic dianhydride, 3,4,3',4'-biphenyltetracarboxylic dianhydride, 3,4,3',4'-benzophenonetetracarboxylic dianhydride, or 3,4,3',4'-diphenylsulfonetetracarboxylic dianhydride.

13. A polyamic acid varnish, obtained by dissolving a polyamic acid as defined in claim 8 in a solvent.

14. A polyimide, obtained by the imidation of a polyamic acid as defined in claim 8.

* * * * *